US006831507B2

(12) United States Patent
Granville

(10) Patent No.: US 6,831,507 B2
(45) Date of Patent: Dec. 14, 2004

(54) TRANSCONDUCTANCE AMPLIFIERS

(75) Inventor: Edward M. Granville, Edinburgh (GB)

(73) Assignee: Wolfson Microelectronics, Ltd., Edinburgh (GB)

( * ) Notice: Subject to any disclaimer, the term of this patent is extended or adjusted under 35 U.S.C. 154(b) by 0 days.

(21) Appl. No.: 10/247,357

(22) Filed: Sep. 20, 2002

(65) Prior Publication Data
US 2004/0046605 A1 Mar. 11, 2004

(30) Foreign Application Priority Data

Oct. 10, 2002 (GB) .............................................. 0220990

(51) Int. Cl.$^7$ ................................................ H03F 1/02
(52) U.S. Cl. ............................. 330/9; 330/51; 327/124
(58) Field of Search ....................... 330/9, 51; 327/124, 327/307

(56) References Cited

U.S. PATENT DOCUMENTS

| | | | |
|---|---|---|---|
| 4,404,525 A | | 9/1983 | Amir et al. |
| 4,894,620 A | * | 1/1990 | Nagaraj ...................... 327/554 |
| 5,331,222 A | * | 7/1994 | Lin et al. .................... 327/554 |
| 5,475,337 A | * | 12/1995 | Tatsumi ...................... 327/554 |
| 5,684,485 A | | 11/1997 | Paillardet et al. |
| 5,689,201 A | * | 11/1997 | Temes et al. .................. 327/95 |
| 5,847,600 A | | 12/1998 | Brooks et al. |
| 6,011,433 A | | 1/2000 | Nairn |
| 6,150,851 A | | 11/2000 | Ohmi et al. |
| 6,169,427 B1 | | 1/2001 | Brandt |
| 6,239,733 B1 | | 5/2001 | Lin |
| 6,538,491 B1 | * | 3/2003 | Spanoche ................... 327/337 |

FOREIGN PATENT DOCUMENTS

| | | |
|---|---|---|
| FR | 2 604 835 A1 | 4/1988 |
| GB | 2095946 A | 10/1982 |

OTHER PUBLICATIONS

H. Bilhan et al., "A 13 Bit 20 Ms/s Current Mode Pipelined Analog to Digital Converter", IEEE, vol. 1, Aug. 8, 1999, pp. 186–189.

K. Fong et al., "A 10 Bit Semi–Automatic Current Mode DAC", Proceedings of the International Symposium on Circuits and Systems, Chicago, May 3–6, 1993, New York, IEEE, vol. 2, pp. 978–981.

* cited by examiner

Primary Examiner—Khanh Van Nguyen
(74) Attorney, Agent, or Firm—Dickstein Shapiro Morin & Oshinsky LLP

(57) ABSTRACT

A transconductance difference amplifier (300) is described, for providing an output current dependent upon a difference between a first input voltage (302) and a second input voltage (304). The difference amplifier comprises an input sampling capacitor (306) having two conductors; a transconductance amplifier (312) having an input (318) coupled to a first conductor of said input sampling capacitor and a current output (314) for generating said output current; and an input switch (308, 310) for selectively coupling a second conductor of said input sampling capacitor to a first input of said difference amplifier for receiving said first input voltage and to a second input of said difference amplifier for receiving said second input voltage. The difference amplifier couples said second conductor to one of the inputs and applies a voltage to said first conductor and then couples said second conductor to the other input to provide a voltage change to said transconductance amplifier input dependent upon said input voltage difference.

36 Claims, 10 Drawing Sheets

US 6,831,507 B2

TRANSCONDUCTANCE AMPLIFIERS

FIELD OF THE INVENTION

This invention generally relates to transconductance amplifiers, that is amplifiers which produce an output current in response to an input voltage, and to analogue-to-digital converters (ADCs) employing such amplifiers. More particularly the invention relates to transconductance amplifiers in which an output current depends upon the difference between two input voltages, and to their applications.

BACKGROUND TO THE INVENTION

In many ADC designs an analogue input voltage is compared to a reference voltage (or a plurality of reference voltages) to produce a voltage output which can be used to generate a digital output code. Exemplary voltage comparators are described in U.S. Pat. No. 6,150,851, U.S. Pat. No. 6,356,148, U.S. Pat. No. 6,249,181 and D. R. Beck and D. J. Allstot, "An 8-bit, 1.8V, High Speed Analogue-to-Digital Converter" (http://students.washington.edu/beckdo/papers/techcon2000.doc) and P. Setty, J. Barner, J. Plany, H. Burger and J. Sonntag, "A 5.75b 350MSamples/S or 6.75b 150MSamples/S reconfigurable/ADC for a PRML Read Channel", Session 9 IEEE International Solid-State Circuit Conference 5–7 February 1998 (ISSCC98). Sample and Hold (S/H) circuits for ADCs are also known, such as those described in U.S. Pat. No. 6,169,427 and U.S. Pat. No. 5,963,156 and N. Waltari and K. Halonen, "1.0-Volt, 9-bit Pipeline CMOS ADC", 26$^{th}$ European Solid-State Circuit Conference Stockholm, Sweden 19-21 September 2002 which all use a conventional (voltage output) operational amplifier with switched capacitor feedback. Also known are Successive-Approximation-Register (SAR) analogue-to-digital converters (see, for example, J. L. McCreary and P. Gray, IEEE JSSC SC-10 pp371–9, Dec 1975) which compare an analogue input with the output of a digital-to-analogue converter (DAC), which DAC may employ a binary-weighted capacitor array to generate an analogue output voltage using charge redistribution between the capacitors.

The above-mentioned analogue-to-digital converters use voltage comparisons to generate a digital output. It will be appreciated that when comparing an input voltage to a reference voltage only gain, and not linearity is important since it is merely necessary to know whether the input is above or below the reference. However it is also known to simplify ADC circuits by summing currents generated by interpolating between reference voltages, and for this interpolation-type summing linearity is an important requirement. Interpolating ADCs are often used for low-resolution high-or medium-speed applications. FIG. 1 shows a generalised circuit diagram of an exemplary stage of a current-mode interpolating ADC. Examples of ADCs with current-mode interpolation are described in M. P. Flynn and D. J. Alstot, "CMOS Folding A/D Converters with Current-Mode Interpolation", IEEE JSSC, vol. 31, September 1996 pages 1248–1257; M. P. Flynn and B. Sheahan, "A 400MSample/S, 6-b CMOS Folding and Interpolating ADC" IEEE JSSC, vol. 33, Dec. 1998, pages 1932–1938; B-S Song, P. L. Rakers and S. F. Gillig, "A 1V, 6-b 50MSamples/S Current Interpolating CMOS ADC", IEEE J. Solid-State Circuits, vol. 35, April 2000, pages 647–651.

Referring to FIG. 1a, the general principle is to generate a plurality of comparison levels (five in FIG. 1) from a smaller set of reference voltages (two, VrefA and VrefB, in FIG. 1) by interpolating between the outputs from a set of amplifiers (two in FIG. 1), each of which outputs represents the difference between an input signal and one of the references.

In the interpolating stage 100 of FIG. 1a an input voltage on line 102 is provided to one input of first 104 and second 106 differential transconductance amplifiers. A second input to the first transconductance amplifier 104 is provided by a first reference voltage VrefA on line 108 and a second input to differential transconductance amplifier 106 is provided by a second reference voltage VrefB on line 110. Each differential transconductance amplifier generates an output current in proportion to the difference between the voltages on its two inputs, the ratio of output current to input voltage difference being termed the transconductance. Amplifiers 104 and 106 are drawn as current sinks but preferably their output currents can be of either positive or negative polarity according to the polarity of Vin-VrefA and Vin-VrefB respectively.

FIG. 1b illustrates one possible implementation of a transconductance amplifier 130 suitable for use for transconductance amplifiers 104 and 106. The transconductance amplifier comprises a pair of input transistors 132, 134 with inputs from, respectively, Vin 102 and one of VrefA 108 and VrefB 110, and a common source connection connected to a constant current sink 136. The drain connections of transistors 132 and 134 are connected to respective input and output connections of a current mirror enclosed by dashed line 138, and a current output connection 140 is taken from the junction of the drain of transistor 134 with the output of current mirror 138. Each of transistors 132, 134 passes an incremental current given by its transconductance gm, multiplied by the incremental gate input voltage of the transistor so that the output current is given by Iout=Gm.(Vin−Vref) where the transconductance, Gm, of the amplifier is equal to gm.

The output current from transconductance amplifier 104 is input to or drives a first current mirror 112 and the output current from transconductance amplifier 106 drives a second current mirror 114. Current mirror 112 comprises a plurality of constant current generators 112a–e. In a conventional manner, a voltage on line 116 sets the current through element 112a to be the same as the output current flowing into differential transconductance amplifier 104. This same drive voltage is also provided to elements 112b–e to provide constant current outputs on lines 118a–d determined by the output current of transconductance amplifier 104.

FIG. 1c shows an example of a controllable current generator 150 suitable for use in the interpolating ADC stage 100 of FIG. 1a. An input transistor 151 and a constant current sink 152 are connected in series between power supply lines 154, 156, a connection between transistor 151 and current sink 152 providing a current output Iout 158. Input transistor 151 has a control voltage Vc applied to its gate connection to provide a controlled, unipolar current equal to the sum of the output current Iout and the current through the constant current sink 152. Thus the output current may be of either polarity depending upon the magnitude of the controlled unipolar current through input transistor 151. For a given input control voltage Vc the output current (or the outputs of a plurality of matched controllable current generators) can be scaled by scaling the dimensions of input (MOS) transistor 151. The current sink 152 is preferably scaled in the same ratio to maintain a constant "zero current" point. In this way a plurality of differently-scaled, matched controllable current generators may be arranged to have zero output current for substantially the same input control voltage, and thus to provide zero output current substantially simultaneously.

Where transistors comprising elements 112a and 112b have the same physical size the current on line 118a is substantially the same as the current through element 112a. The sizes of transistors comprising elements 112c, d, e are reduced to 0.75×, 0.5× and 0.25×that of element 112b so that respective currents of 0.75×, 0.5× and 0.25× the output current from transconductance amplifier 104 are provided on lines 118b, 118c and 118d. Generally current mirror 112 is fabricated on an integrated circuit so that the transistors comprising the current mirror are matched. Current mirror 114 likewise comprises elements 114a–e, for example bipolar or FET transistors, and operates in a corresponding manner to provide, respectively, currents of 1.0×, 0.75×, 0.5×, and 0.25× the output current of transconductance amplifier 106 on lines 120a–d.

The current I1 on line 118a is provided to a comparator 122a to generate a digital output D1. Digital output D2 from comparator 122b is determined by a sum of the currents on lines 118b and 120d; output D3 from comparator 122c is determined by a sum of currents on lines 118c and 120c; output D4 from comparator 122d is determined by a sum of currents on lines 118d and 120b and digital output D5 from comparator 122e is determined by the current in line 120a. Denoting the output current of transconductance amplifier 104 $I_A$ and the output current of transconductance amplifier 106 $I_B$, $I_A$ is proportional to the difference between Vin on line 102 and VrefA on line 108 and $I_B$ is proportional to the difference between Vin and VrefB on line 110. The summed intermediate currents are proportional to a fraction of the difference between Vin and VrefA plus a fraction of the difference between Vin and VrefB. In mathematical terms:

$$I_1 = I_A = G(Vin - VrefA)$$

$$I_5 = I_B = G(Vin - VrefA)$$

$$I_2 = 0.75\ G(Vin - VrefA) + 0.25G(Vin - VrefB)$$

therefore $$I_2 \propto Vin - (0.75\ VrefA + 0.25 VrefB)$$

and $$I_2 \propto Vin - (3VrefA + VrefB)/4.$$

In other words these scaled currents generate output currents proportional to the residues [Vin−Vth(i)] i=1 ... 5 where:

$$Vth(1) = VrefA,$$

$$Vth(2) = (3.VrefA + VrefB)/4,$$

$$Vth(3) = (VrefA + VrefB)/2,$$

$$Vth(4) = (VrefA + 3.VrefB)/4,$$

$$Vth(5) = VrefB.$$

It can be seen that where Vin=Vth the output current is zero and that for Vin>Vth the output current is positive and for Vin<Vth the output current is negative. Thus the output currents I1 to I5 will cross zero at input voltages equal to thresholds Vth(1), ..., N where N=(2+no. of intermediate values), in this case 5 (i.e. 2+3). In the interpolating stage circuit 100 of FIG. 1 the output currents I1 to I5 are applied to high input impedance comparators 122a to 122e respec-tively which make logic decisions at these thresholds. Thus input voltage Vin signal levels between VrefA and VrefB are converted to a digital format output on lines D1 to D5 as a so-called thermometer code. This code is then converted to a binary code by conventional means (not shown in FIG. 1). This may comprise, for example, a priority encoder or alternatively the functionality of the hardware may be specified in a hardware description language such as Verilog (Trade Mark) or VHDL, allowing a hardware synthesis tool to blend in the code conversion functionality with other back-end logic such as error correction logic.

Although in FIG. 1 only two reference voltages, VrefA and VrefB, are illustrated more reference voltages may be employed for multiple (binary) bit conversion. The reference voltages are typically derived from a resistor string and the skilled person will appreciate that compared to a conventional/analogue-to-digital converter fewer taps on such a resistor string are necessary since fewer reference voltages are required. Furthermore the amplification of the residue signal also eases the requirements on the comparators, and in particular the requirements on their omitted input offset voltage and overdrive. Typically this saves the need for a preamplification stage before each comparator, so that the overall circuit is simpler despite the added current mirrors and linear transconductance amplifiers.

One application of an interpolating ADC is as the second stage of a two-stage analogue-to-digital converter such as, the analogue-to-digital converter 200 shown in FIG. 2. In this ADC an input voltage Vin on line 202 is provided to an M-bit ADC 204 which outputs the M most significant bits (MSBs) of the digitised signal on line 206. This coarse approximation to the input voltage Vin is converted back to an analogue voltage by an M-bit digital-to-analogue converter 208 and subtracted from the original input signal by subtractor 210 to leave a residual signal on line 212. This residual signal is presented to an N-bit analogue-to-digital converter 214 which generates the N least significant bits (LSBs) on line 216 which are combined with the MSBs by suitable logic in combiner 218 to provide a digital output 220 with the required total number of binary bits. An example of such a two-stage ADC is described in "A 3.3-V, 10-b, 25-MSample/s Two-Step ADC in 0.35-µm CMOS", Hendrik van der Ploeg and Robert Remmers, IEEE Journal of Solid State Circuits, Vol 34, No 12, December 1999. The coarse and fine stage conversions ranges may be overlapped to ease constraints on the coarse stage ADC.

It can be seen by inspection of FIG. 2 that the first stage ADC 204 must first make its decision and then the output of DAC 208 and of the difference amplifier 210 must settle before second stage comparators associated with ADC 214 make their decision. Thus the first stage must sample its input signal well before the second stage decision time. To avoid conversion errors it has previously been necessary to precede such a two-stage ADC with a sample-and-hold circuit to hold the input constant between the two sampling instants. This increases the complexity of the ADC, thus increasing its cost, and also increases the power consumption. It is therefore desirable to be able to dispense with such a sample-and-hold circuit, particularly whilst retaining the linearity desirable for interpolation-type summing and other linear signal processing.

SUMMARY OF THE INVENTION

According to a first aspect of the present invention there is therefore provided a difference amplifier configured for providing an output current dependent upon a difference between a first input voltage and a second input voltage, the difference amplifier comprising an input sampling capacitor having two conductors; a transconductance amplifier having an input coupled to a first conductor of said input sampling capacitor and a current output suitable for generating said output current; and an input switch for selectively coupling a second conductor of said input sampling capacitor to a first input of said difference amplifier for receiving said first input voltage and to a second input of said difference amplifier for receiving said second input voltage; the difference amplifier being configured to, in a first state, couple said second conductor to one of said first and second inputs and apply a voltage to said first conductor and to, in a second state, couple said second conductor to the other of said first and second inputs to provide a voltage change to said transconductance amplifier input dependent upon said difference between said first and second input voltages.

Preferably, the output current is substantially linearly dependent upon the difference between the first and second input voltages. The output current may be provided directly from the transconductance amplifier or the current generated by the transconductance amplifier may be mirrored or used in some other way to provide an output current for said difference amplifier.

The input sampling capacitor allows one input voltage, say the first, to be sampled in the difference amplifier's first state, to set a charge on the input sampling capacitor. Then, when the second conductor of the input sampling capacitor is connected to the other input voltage, say the second, the voltage difference between the inputs is transferred to the input of the transconductance amplifier which provides a current output for generating, either directly or indirectly, the output current from the difference amplifier. A controller may be employed to control this sampling process. Provided that the transconductance amplifier is itself linear the difference amplifier is also substantially linear.

In operation the first voltage is sampled onto the input capacitor at the end of the first state, but its value is held and subtracted from the second voltage during the second state. The output current resulting from the difference voltage may be sampled (by a following comparator) at the end of the second state, giving the second voltage additional time to settle. This sample and hold action is particularly useful for two-stage ADCs, where the first voltage can be the original input signal, and the second voltage is a reference voltage chosen by a "coarse" ADC also sampling the input signal. Since the second, reference voltage is not needed until the start of the second state the "coarse" ADC has time to settle, and the need for a separate sample-hold circuit can be avoided.

In a refinement of the difference amplifier one or more additional input sampling capacitors may be provided. Such an additional input sampling capacitor may be switched between two reference voltages and where a plurality of difference amplifiers is employed, for example in an two-stage ADC, one of these reference voltages may be common to all the difference amplifiers and the other reference voltage applied to each difference amplifier may be tied to respective points in a ladder of reference voltages.

In this way the effective operating points of the difference amplifiers may be spaced apart, for example substantially equidistantly, to provide two or more output currents which may be summed for use by an interpolating ADC. Each difference amplifier may be arranged to generate multiple scaled output currents, for example for use in current-mode interpolation.

It will be recognized that the first conductor of the input sampling capacitor need not be connected to the transconductance amplifier input in the difference amplifier's first state and it could, for example, be coupled to the input of the transconductance amplifier via a switch. However in a preferred embodiment the voltage applied to the first conductor in the first state of the difference amplifier is a virtual earth voltage, that is for a differential transconductance amplifier a voltage on one of the inputs is maintained by a closed feedback path to be substantially the same as a (preferably fixed) voltage on the other differential input. This can be provided by means of a switched DC feedback path, either from the output of the transconductance amplifier or from a later stage in the difference amplifier such as after an output drive device, for example a device providing a mirrored or split output current. In a preferred embodiment a positive differential input of the transconductance amplifier is connected to a fixed reference voltage such as ground and a negative differential input of the transconductance amplifier is connected to the input sampling capacitor. Preferably a low resistance switch such as an FET switch is then provided to couple the negative differential input to a current output of the difference amplifier. This virtual earth connection allows the input offset voltage of the transconductance amplifier to be cancelled.

The voltage change provided to the transconductance amplifier input in changing from the first to the second state of the difference amplifier may be substantially equal to the difference between the first and second input voltages, for example where there is only a single input sampling capacitor or the voltage change may be scaled, for example where there is some charge sharing between two or more input sampling capacitors.

A differential difference amplifier may be constructed along similar lines, using a pair of the above-described difference amplifiers, but using a shared, differential transconductance amplifier so that, in effect, one input switch and one set of first and second input voltages is associated with each differential input (positive and negative) of the differential transconductance amplifier. In this way, the differential difference amplifier is responsive to a differential signal comprising two sets of voltage differences between two sets of said first and second input voltages. Generally speaking, one set of first input voltages will comprise a positive and negative first input voltage and one set of second input voltages will comprise a positive and negative second input voltage. The circuit may similarly be extended, as described above, by providing one or more additional sets of (differential) input sampling capacitors and/or by adding further (differential) transconductance amplifiers and/or by mirroring or otherwise providing a plurality of single-ended or differential outputs.

Thus in a related aspect the invention also provides a differential difference amplifier for providing an output current dependent upon a differential signal at a differential input comprising two pairs of signal inputs, said differential signal comprising two voltage differences, a first being dependent upon a difference between first and second input voltages on a first pair of said pairs of signal inputs, a second being dependent upon a difference between third and fourth input voltages on a second pair of said pairs of signal inputs, said differential difference amplifier comprising: first and second input sampling capacitors, each having two conductors, for said first and second pair of signal inputs respectively; a differential transconductance amplifier having a differential input coupled to said first and second input sampling capacitors and an output for generating said output current; a pair of input switches, one for each of said pair of signal inputs, for selectively coupling said first and second input sampling capacitors respectively to one of said first and second input voltages and to one of said third and fourth input voltages; a pair of initialisation switches to bring plates of said first and second input sampling capacitors coupled to said differential transconductance amplifier to initial voltages; and a controller to control said input switches and said initialisation switches to apply said differential signal to said differential transconductance amplifier.

The plates of the sampling capacitors may be brought to the same initial voltage or to different initial voltages, the output current may either comprise a single-ended or a differential output current and, again, the circuit may be extended by providing additional pairs of sampling capacitors for additional differential inputs, each additional pair of sampling capacitors having an associated pair of input switches for determining a pair of input voltage differences.

According to another aspect of the present invention there is provided an analogue-to-digital converter comprising at least one transconductance amplifier configured to provide a plurality of output currents at a plurality of outputs; and a plurality of comparators coupled to said plurality of transconductance amplifier outputs for providing a digital output; at least one switched input sampling capacitor coupled to an input of said transconductance amplifier; and at least one switch configured to couple said input sampling capacitor alternately to a first reference voltage and to an analogue voltage for conversion.

The analogue-to-digital converter may comprise, for example, a current-mode interpolating or folding converter, preferably comprising a plurality of stages. As previously described, by providing an input sampling capacitor and a switch to alternately couple the capacitor to an analogue voltage for conversion and to a reference voltage a sampling difference amplifier is provided which, in embodiments enables a prior sample-hold to be dispensed with. In embodiments a pair of input sampling capacitors may be provided for each of a plurality of transconductance amplifiers, to allow for combinations of output currents with zero crossings at regularly spaced input voltage thresholds, thereby creating a ladder of zero crossing threshold voltages for use in generating the digital output. In embodiments the digital output comprises a thermometer code which is converted to a binary representation.

The analogue-to-digital converter may be used as the second stage in a two-stage analogue-to-digital converter in which a first analogue-to-digital converter provides a digital output to a first number of (most significant) bits accuracy to provide a coarse approximation to an analogue input signal. This coarse approximation may then be used as the reference voltage for the input sampling capacitor for generating one or more least significant output bits of the two-stage analogue-to-digital converter.

According to a related aspect of the invention there is provided a method of generating a current in substantially linear dependence upon a voltage difference between first and second voltages using a circuit comprising a switch, a switched input capacitor, and a substantially linear transconductance amplifier, a first plate of the input capacitor being coupled to an input of the transconductance amplifier, a second plate of the input capacitor being switchably couplable to the first and second voltages, the method comprising coupling the second plate of the input capacitor to the first voltage whilst maintaining the first plate at a reference voltage to charge the input capacitor; and then coupling the second plate of the input capacitor to the second voltage and allowing the potential of the first plate to change by an amount dependent upon said voltage difference to cause said transconductance amplifier to generate an output current substantially linearly dependent upon said voltage difference.

When the input capacitor is connected to the first voltage and to the reference voltage it is charged, that is it is brought to a defined state of charge by charge flowing onto or off the capacitor. Then by connecting the second plate of the input capacitor to the second voltage the difference between the first and second voltages is substantially transferred to the input of the transconductance amplifier.

In another aspect the invention provides a method of generating a current substantially linearly dependent upon two voltage differences, a first voltage difference between first and second voltages and a second voltage difference between third and fourth voltages, the method employing a circuit comprising first and second switches, first and second switched input capacitors, and a substantially linear transconductance amplifier, a first plate of the first input capacitor and a first plate of the second input capacitor being coupled together and coupled to an input of the transconductance amplifier, a second plate of the first input capacitor being coupled to the first switch for switchable coupling to the first and second voltages and a second plate of the second input capacitor being coupled to the second switch for switchable coupling to the third and fourth voltages, the method comprising coupling the second plates of the first and second input capacitors to the first and third voltages respectively whilst maintaining the first plates of the capacitors at a reference voltage, to charge the input capacitors; and then coupling the second plates of the first and second input capacitors to the second and fourth voltages respectively and allowing the charge on the first plates of the capacitors to be shared such that the potential of the first plates changes by an amount dependent upon both said first and second voltage differences to cause said transconductance amplifier to generate output current substantially linearly dependent upon both said voltage differences.

The input capacitors may be of different sizes or values, thus providing proportionate scaling of the respective input voltages.

There is also provided a difference amplifier configured to operate in accordance with these methods.

In a further aspect the invention provides a method of operating a two-stage analogue-to-digital converter, the two-stage analogue-to-digital converter comprising a first analogue to digital converter to provide a coarse approximation to an analogue input signal and a second analogue-to-digital converter comprising at least one difference amplifier configured for providing an output current dependent upon a difference between a first input voltage and a second input voltage, the difference amplifier comprising a transconductance amplifier for providing said output current for a comparator for providing a digital output, at least one switched input sampling capacitor coupled to an input of said transconductance amplifier, and at least one switch configured to couple said input sampling capacitor alternately to said first and second input voltages, the method comprising controlling said switch to couple said input sampling capacitor first to an analogue voltage for conversion and then to said coarse input signal approximation to provide a reference voltage.

Preferably the difference amplifier output current is substantially linearly dependent upon the difference between the first and second input voltages. More preferably the method comprises using a plurality of difference amplifiers for comparing the coarse input signal approximation with a plurality of reference levels, preferably by offsetting the reference levels of the difference amplifiers using a second switched input sampling capacitor for each amplifier.

The invention also provides an analogue-to-digital converter configured to operate in accordance with this method.

BRIEF DESCRIPTION OF THE DRAWINGS

These and other aspects of the present invention will now be further described, by way of example only, with reference to the accompanying figures in which.

DETAILED DESCRIPTION OF PREFERRED EMBODIMENTS

Figure 3A:
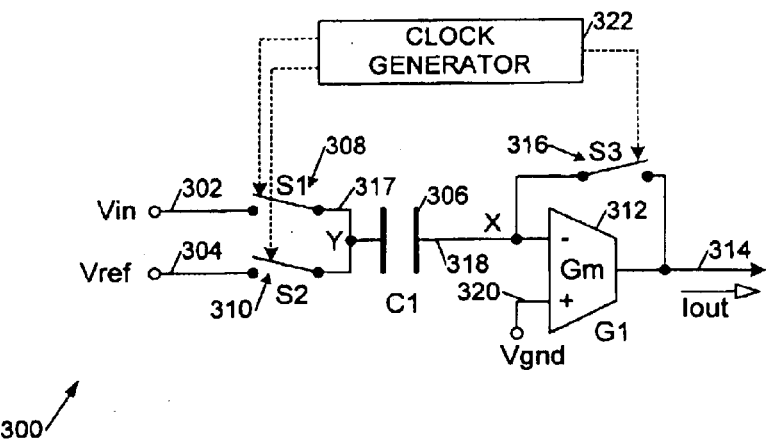
FIGS. 3a to 3d show, respectively, a difference amplifier according to a first embodiment of the present invention, waveforms for the circuit of FIG. 3a, a differential version of the amplifier of FIG. 3a, and timing waveforms for the circuit of FIG. 3c.

Referring first to FIG. 3a, this shows a schematic circuit diagram of a difference amplifier 300. An input voltage Vin is provided on line 302 and a reference voltage Vref is provided on line 304. An input sampling capacitor C1 306 has one plate coupled to a pair of switches S1 308, S2 310, respectively connecting lines 302 and 304 to capacitor 306. Switches 308 and 310 are controllable to allow either line 302 or line 304 to be connected to input sampling capacitor 306 and may comprise MOSFET or FET switches. The skilled person will appreciate that the illustration of switches 308 and 310 in FIG. 3a is diagrammatic and that other functionally equivalent switching configurations may be employed.

The other plate of the input sampling capacitor 306 is coupled to an inverting input of a differential transconductance amplifier 312 which provides a current output Iout on line 314. A third switch 316 is connected between output line 314 and node X 318 between input sampling capacitor 306 and the inverting input of transconductance amplifier 312. Again switch S3 316 is controllable and may comprise a MOSFET or a FET. A non-inverting differential input of transconductance amplifier 312 is connected to a fixed potential, as illustrated a ground potential Vgnd. Transconductance amplifier G1 312 has a transconductance of Gm. The three switches 308, 310 and 316 are controlled by a clock generator 322, as described in more detail below with reference to FIG. 3b.

In many applications difference amplifier 300 is constructed on an integrated circuit, typically comprising part of an analogue-to-digital converter. The skilled person will understand that standard building blocks may be employed for the various elements and the transconductance amplifier may be implemented, for example, using a long-tailed bipolar or MOS pair.

Figure 3B:
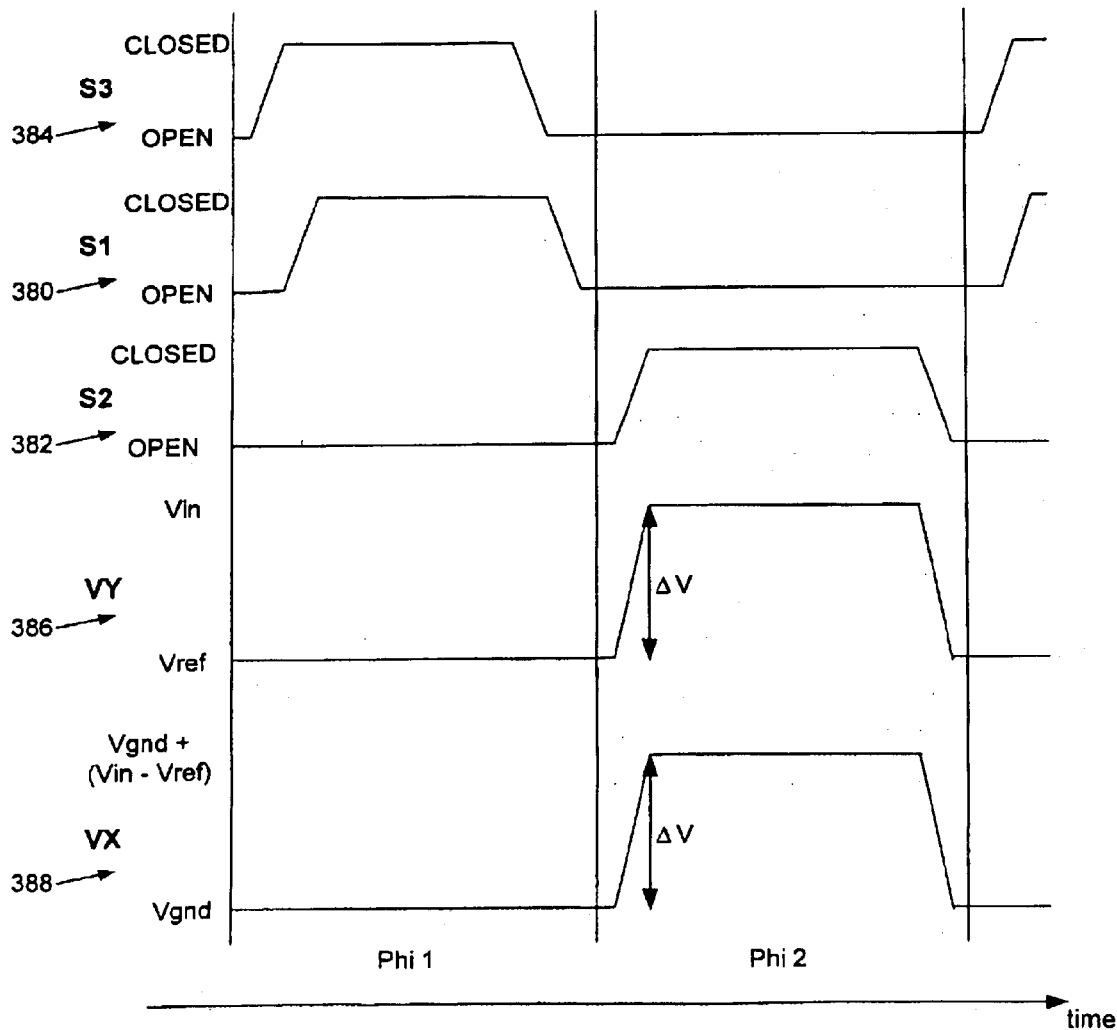

Referring now to FIG. 3b, the circuit has two clock phases, Phi1 and Phi2. FIG. 3b shows the respective statuses 350, 352, 354 of switches S1 308, S2 310 and S3 316 during these two clock phases as well as respective voltages 356, 358 at node Y 317 and node X 318. During clock phase Phi1 switch S3 316 is closed to connect together the output and the (inverting) input of transconductance amplifier 312, so that the voltage at node X 318 settles to the same voltage as that on the inverting input 320 of transconductance amplifier 312, that is Vgnd. This is because node X 318 is a virtual earth, although the skilled person will understand that in this context the voltage at node X is substantially the same as the voltage on non-inverting input 320 but, in some embodiments, this voltage may not be zero volts.

Also during clock phase Phi1 switch S1 308 is closed to connect the left hand side of input sampling capacitor C1 306 (node Y) to Vin 302, and switch S2 310 is open. Thus the voltage of node Y is equal to Vin. In the second clock phase Phi2 switch S3 316 is opened, switch S1 308 is opened and switch S2 310 is closed, causing the voltage at node Y 317 to step up by $\Delta V = Vref - Vin$. This in turn causes the voltage at node X 318 to step up by the same amount from Vgnd, causing an output current of $Gm \times (Vin - Vref)$, the inversion arising because node X is coupled to the inverting input of transconductance amplifier 312. In practical implementations there is additional capacitance associated with node X, such as the input capacitance of transconductance amplifier 312, and thus the voltage step and consequent output current are attenuated. However this is merely equivalent to a reduction in Gm so that the output current is nonetheless proportional to the difference between Vin and Vref.

As illustrated in FIG. 3b it is preferable that switch S3 316 is turned off slightly before S1 308, to improve charge injection performance. Preferably there is also a slight underlap between S1 and S2 being closed, to avoid a momentary conductive path between Vin and Vref, which could give avoidable load transients on the preceding circuitry generating Vin and Vref.

Figure 3C:
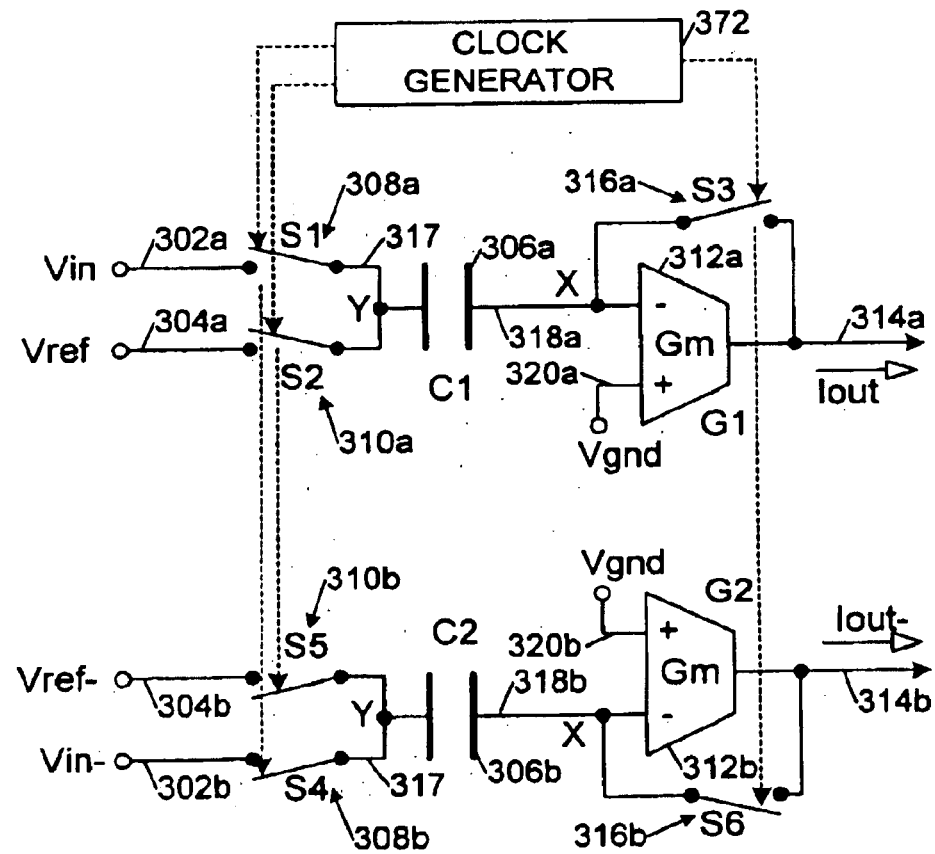
Figure 3D:
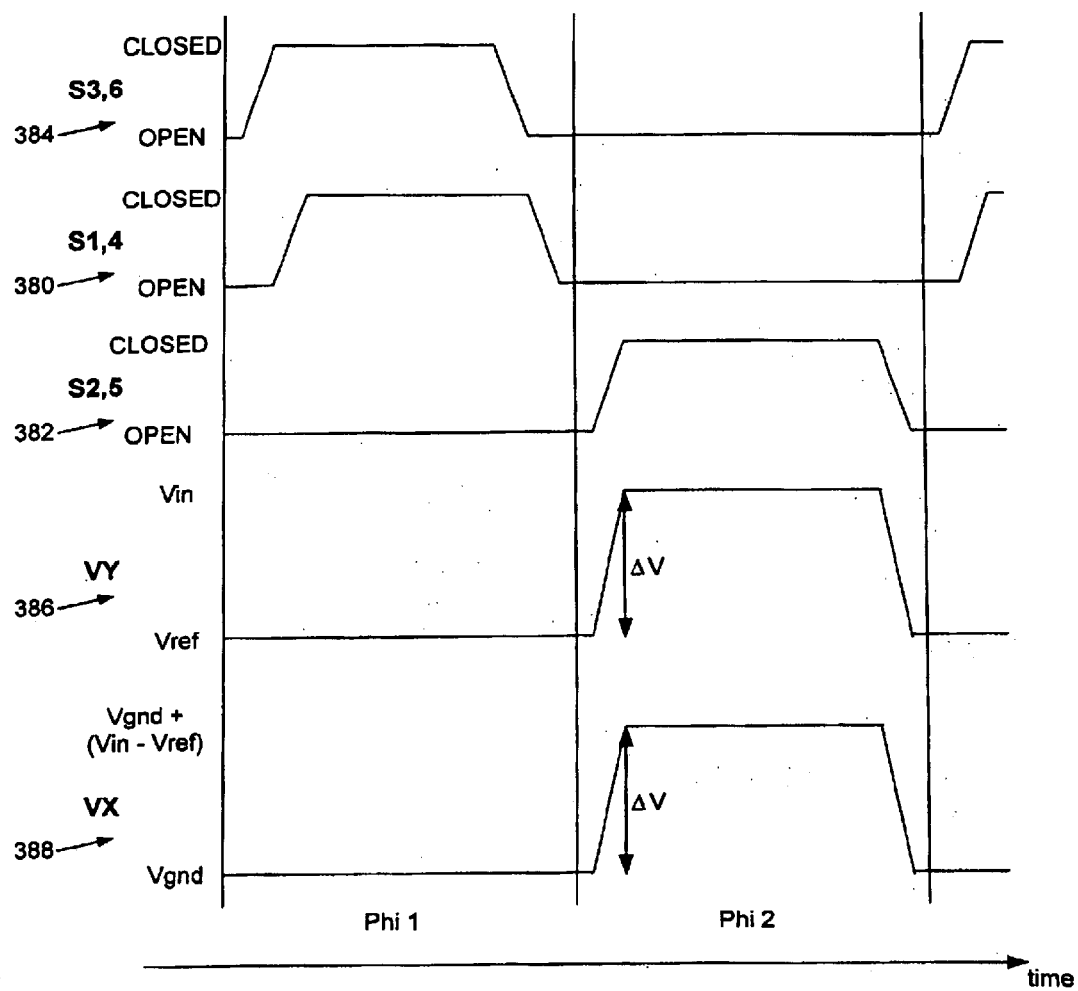

FIG. 3c shows one example of a differential implementation 370 of the differential transconductance amplifier 300 of FIG. 3a, and FIG. 3d shows timing waveforms for the circuit of FIG. 3c.

Broadly speaking the differential circuit of FIG. 3c corresponds to two matched circuits of the type shown in FIG. 3a, although a single clock/timing generator 372 can be used to control both halves of the differential implementation 370. Apart from this, two circuits of the type shown in FIG. 3a are used, one to provide a positive Iout 314*a* and one to provide a negative Iout–314*b* from respective positive and negative differential inputs Vin 302*a, b* and Vref 304*a, b*. In FIG. 3*c* like elements to those of FIG. 3*a* are indicated by like reference numerals, "a" and "b" denoting positive and negative signal processing portions of the circuit respectively.

In mathematical terms, taking the transconductance of amplifier 312*a* to be $Gm^+$ and the transconductance of amplifier 312*b* to be $Gm^-$, $$Iout^+ = Gm^+(Vin^+ - Vref^+)$$

$$Iout^- = Gm^-(Vin^- - Vref^-)$$

$$dIout = Iout^+ - Iout^-$$

$$= Gm^+(Vin^+ - Vref^+) - Gm^-(Vin^- - Vref^-)$$

and where $Gm^+=Gm^-=Gm$, say, (implying that differential transconductance amplifiers G1 312*a* and G2 312*b* are substantially matched):

$$dIout = Gm(dVin - dVref)$$

where $$dVin = Vin^+ - Vin^-$$

and $$dVref = Vref^+ - Vref^-$$

In this way, providing that the positive and negative signal processing circuit portions of the differential difference amplifier implementation 370 are substantially symmetrical and matched, common mode changes to $Vin^+$, $Vin^-$ and/or $Vref^+$, $Vref^-$ are substantially rejected.

The timing diagram shown in FIG. 3*d* for the circuit of FIG. 3*c* is very similar to the diagram of FIG. 3*b* for the circuit of FIG. 3*a*, waveforms 380, 382, 384, 386 and 388 corresponding to waveforms 350, 352, 354, 356 and 358 respectively. Attention is drawn, however, to waveforms 380, 382 and 384 which refer to switches 1 and 4, switches 2 and 5 and switches 3 and 6 respectively rather than simply to switches 1, 2 and 3 as in FIG. 3*b*. Apart from this difference, which takes account of the two matched versions of the circuit of FIG. 3*a* providing a differential implementation of the circuit, the explanation of FIG. 3*d* corresponds to that already given for FIG. 3*b* and, for brevity, will not be repeated.

The skilled person will appreciate that variants on the circuit described with reference to FIGS. 3*c* and 3*d* are possible. For example transconductance amplifiers 312*a* and 312*b* may be implemented as a single fully differential transconductance amplifier.

Figure 4:
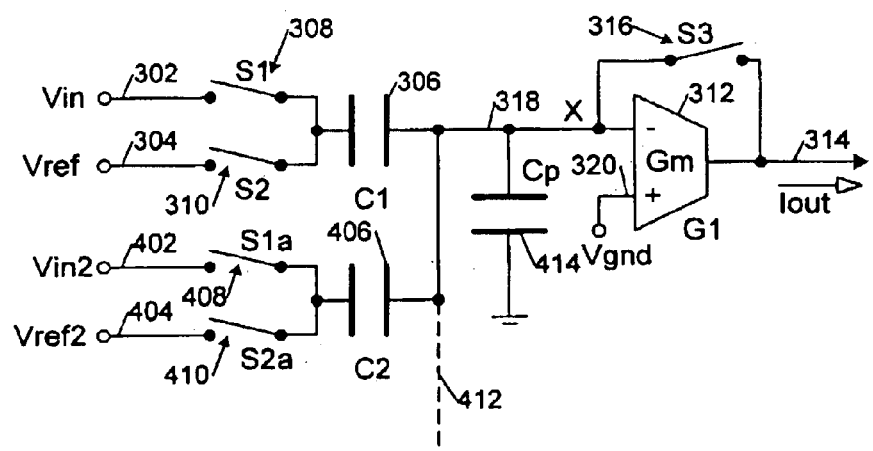
FIG. 4 shows a difference amplifier with multiple input capacitors, according to a second embodiment of the present invention.

FIG. 4 shows a second difference amplifier 400, generalizing the switched input sampling capacitor concept illustrated in FIG. 3*a*. Like elements to those of FIG. 3*a* are indicated by like reference numerals.

In FIG. 4 an additional input sampling capacitor 406 is provided, also coupled to node X 318. The other plate of capacitor 406 is coupled via a first switch S1*a* 408 to Vin2 402 and via S2*a* 410 to Vref2 404. Switches S1*a* 408 and S2*a* 410 are operated in synchrony with switches S1 308 and S2 310 respectively; for simplicity the clock generator is not shown in FIG. 4. FIG. 4 does show the total parasitic capacitance (including the input capacitance of transconductance amplifier 312) on the inverting input of the transconductance amplifier explicitly as a lumped capacitor Cp 414. The dashed line 412 connected to node X 318 indicates that the circuit of FIG. 4 may be extended by adding further input sampling capacitors and associated switches.

Ignoring, for the time being, the parasitic capacitance Cp, the total capacitance is C1+C2. The left hand plate of C1 steps up by a voltage Vref–Vin and the left hand plate of C2 steps up by a voltage Vref2–Vin2. The total charge stored on the two capacitors is $$(Vref - Vin)C1 + (Vref2 - Vin2)C2$$

which when shared over the total capacitance C1+C2 gives rise to a voltage change $\Delta V$ given by $$(C1+C2)\Delta V = (Vref - Vin)C1 + (Vref2 - Vin2)C2.$$

or $$\Delta V = [(Vref - Vin)C1 + (Vref2 - Vin2)C2]/(C1+C2)$$

Where the parasitic capacitance Cp is non-zero the charge is also shared over Cp so that the total effective capacitance is C1+C2+Cp. In this case the voltage change in Phi2, dVin, is given by $$-dVin = -(Vx - Vgnd) \qquad \text{(Equation 1)}$$
$$= [(Vin - Vref)C1 + (Vin2 - Vref2)C2]/$$
$$(C1 + C2 + Cp)$$

and $$Iout = -G.dVin$$
$$Iout = G[(Vin - Vref)C1 + (Vin2 - Vref2)C2]/$$
$$(C1 + C2 + Cp)$$

Often Cp is voltage dependent, however in practical designs this dependence has proven small enough not to be a significant constraint on linearity.

Figure 5:
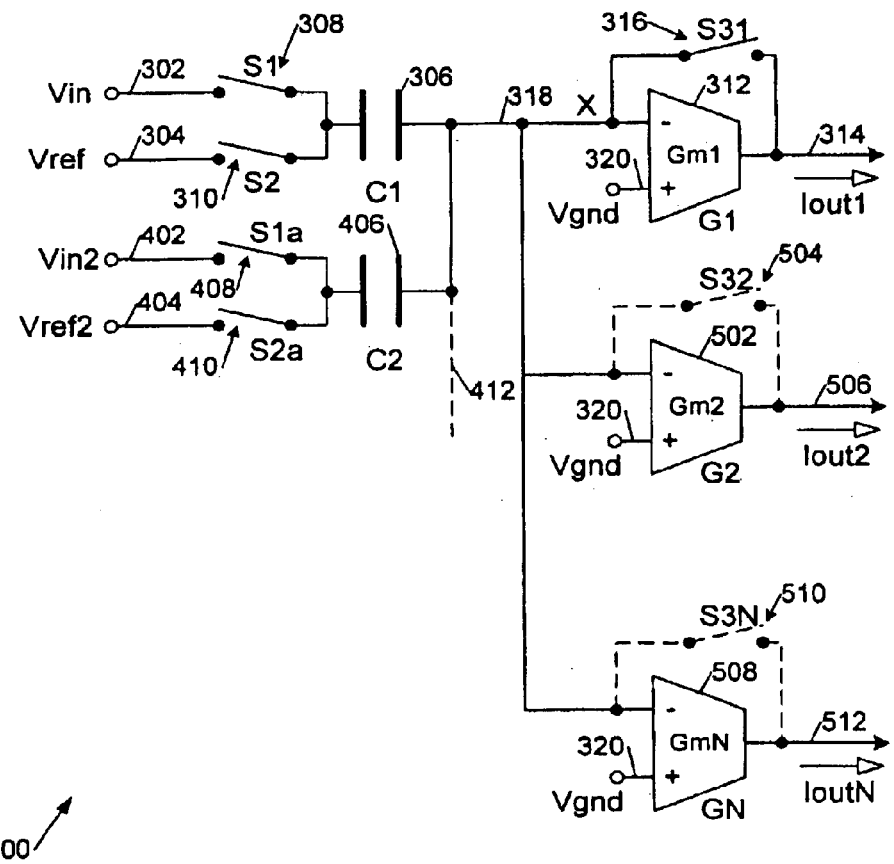
FIG. 5 shows a difference amplifier including a plurality of transconductance amplifiers according to a third embodiment of the present invention.

Referring now to FIG. 5, this shows a third difference amplifier 500, generalising on the arrangement of FIG. 4. Like elements to those of FIG. 4 are indicated by like reference numerals.

In FIG. 5 a plurality of transconductance amplifiers is provided, illustrated by second differential transconductance amplifier G2 502 and Nth differential transconductance amplifier GN 508. Transconductance amplifiers 502 and 508 have their inverting inputs connected to node X 318 and, in the illustrated embodiments, their non-inverting inputs connected to Vgnd 320. Each of these additional transconductance amplifiers has a respective current output 506, 512 and, optionally, a closed loop feedback switch S32 504, S3N 510 to establish node X 318 as a virtual earth. It will be appreciated, however, that only one of switches S31 316, S32 504 and S3N 510 is required.

Each of the differential transconductance amplifiers G1, G2, . . . , GN may have a different transconductance to provide, in effect, a difference amplifier with a plurality of transconductances and a plurality of output, currents in fixed scales or ratios to one another.

Figure 6:
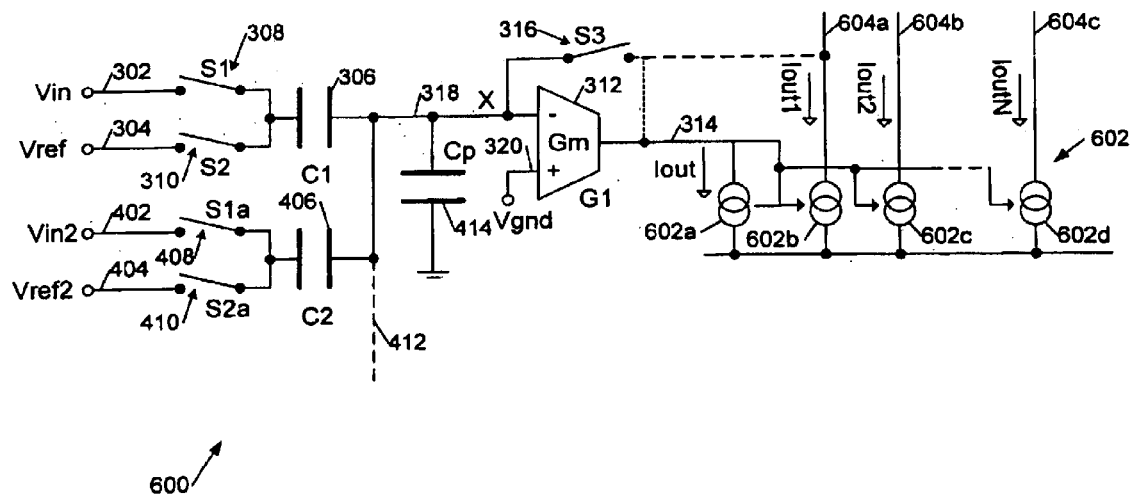
FIG. 6 shows a difference amplifier with a mirrored output, according to a fourth embodiment of the present invention.

In the arrangement of FIG. 6 the output 314 of transconductance amplifier 312 is mirrored by a current mirror 602 to provide multiple outputs. The current mirror comprises a plurality of current sinks 602*a–d* (alternatively current sources may be employed) to provide up to N current outputs of which three 604*a–c* are shown in FIG. 6. Each of current outputs is in a fixed ratio to or multiple of current Iout on transconductance amplifier output 314 and in this way the difference amplifier 600 may be provided with a plurality of outputs with different (overall) transconductances. The multiple output current mirror 602 may be constructed in any conventional manner using FET or bipolar transistors of different sizes or using multiple transistors to provide current ratios other than 1:1. As illustrated in FIG. 6 switch S3 316 may be coupled either directly to the current output 314 of transconductance amplifier 312 or to one of current outputs 604a–c to provide feedback either from the first stage output or from one (or more or all) of the mirror outputs. However this depends upon the polarity of the first stage transconductance in that there should be an overall inversion to allow the closure of S3 316 to create a virtual earth at node X 318.

Figure 7:
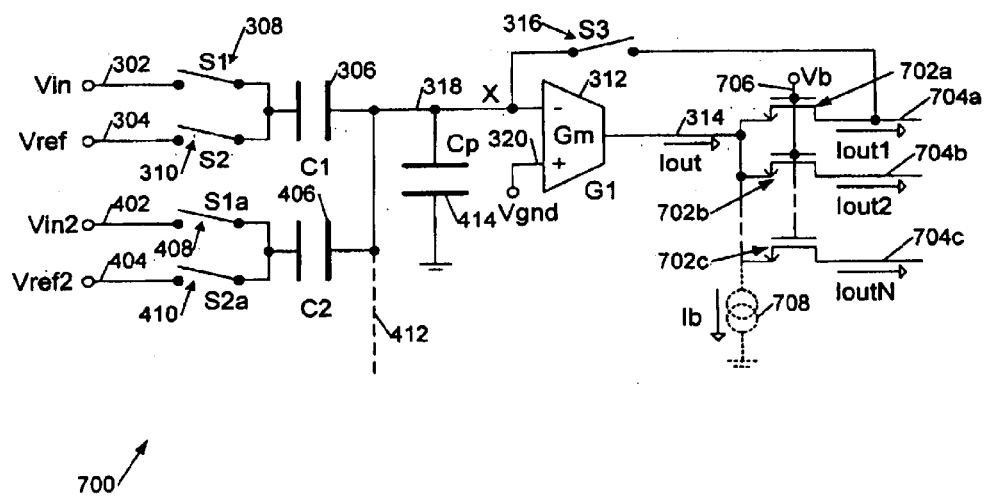
FIG. 7 shows a difference amplifier with a split current output, according to a fifth embodiment of the present invention.

FIG. 7 shows a fifth difference amplifier 700, again generalising on the arrangement of FIG. 4, and again in which like elements of those of FIG. 4 are indicated by like reference numerals.

In the arrangement of FIG. 7 the output current Iout on output 314 of transconductance amplifier 312 is split by a plurality of transistors 702a–c into a plurality of output currents Iout 1, Iout 2, . . . . . Iout N 704a–c. Transistors 702a–c are connected in parallel and have a common control connection 706; in the illustrated embodiment the transistors comprise field effect transistors, preferably NMOS devices, with a common source connection to current output 314 and a common gate connection to a bias voltage on line 706. The drain connections of the transistors provide current outputs 704a–c.

To allow bi-directional output currents Iout 1, Iout 2, . . . , Iout N a constant current sink 708 may be connected to the common source connection of bias transistors 702a–c, and companion constant current sources (not shown in FIG. 7) connected to the current outputs to subtract off the added constant current before the output Iout1, Iout2, . . . IoutN.

As with the arrangement of FIG. 6, the sizes (or other parameters) of transistors 702a-c may be in fixed ratios to generate output currents in fixed ratios to one another. For this reason transistor 702a–c are preferably matched, for example by fabrication on a common substrate. In this way again a plurality of different overall transconductances may be provided for difference amplifier 700. The current introduced by constant current sink 708 will also be scaled in the same ratios, so the above-mentioned companion current sources should also be ratioed in the same ratios.

A differential output equivalent to each of the above-described difference amplifiers, in particular the difference amplifier circuits of FIGS. 4 to 7 and the difference amplifiers of the interpolating ADC stage of FIG. 8 below, may be implemented by replacing all the signal paths in each amplifier by differential equivalents. This has been already been described with reference to FIG. 3 and will be readily understood by the skilled addressee.

Figure 8:
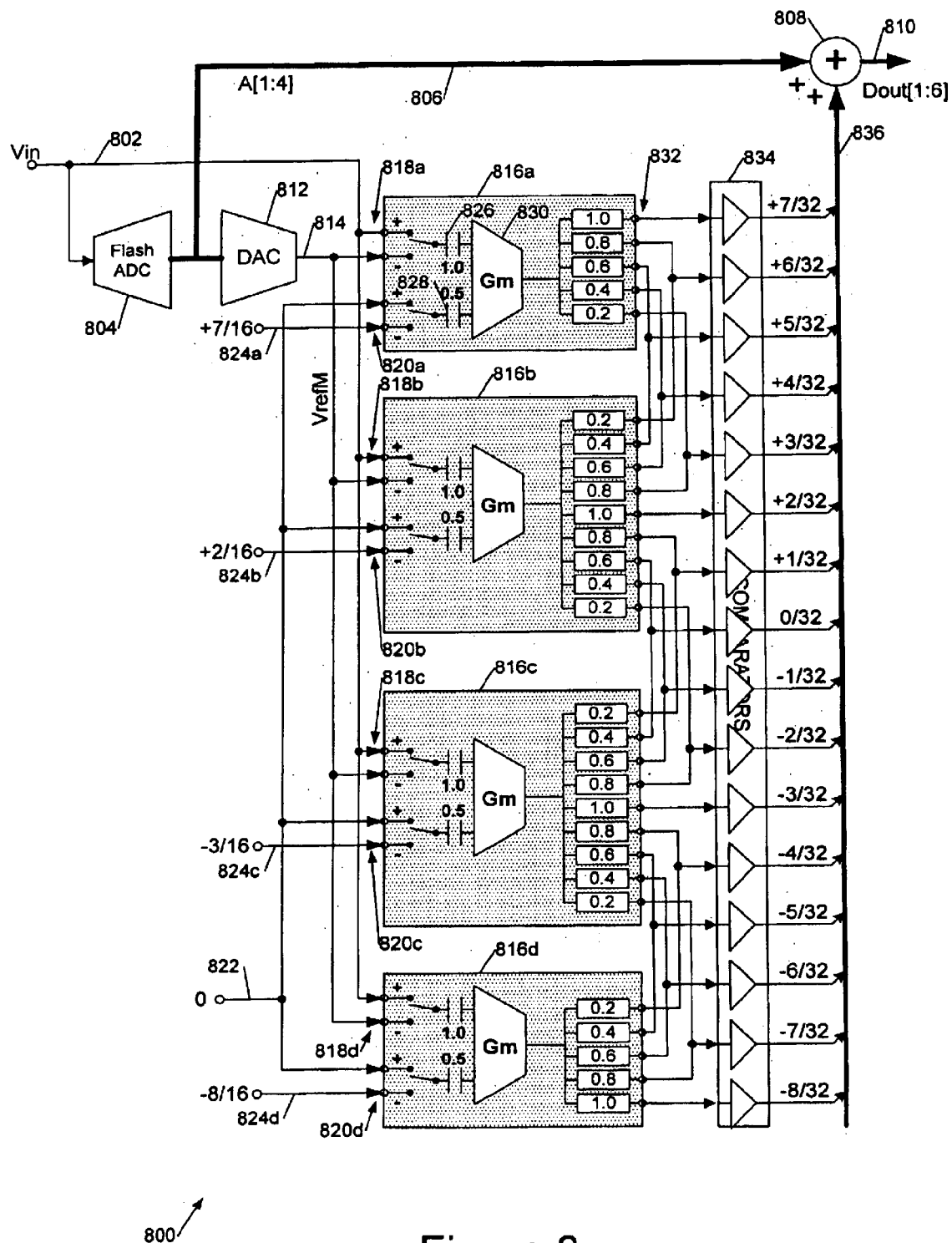
FIG. 8 shows a current-mode interpolating ADC comprising a plurality of sampling difference amplifiers, according to an embodiment of an aspect of the present invention.

FIG. 8 shows a current mode interpolating ADC 800 incorporating a plurality of the above-described difference amplifiers. The switched input sampling capacitor in each of these difference amplifiers provides a relatively cheap and simple alternative to the sample-and-hold circuit which is conventionally employed.

The ADC of FIG. 8 provides a 6-bit conversion accuracy and may be employed, for example, as a 6-bit back end to follow a 10-bit pipeline, to produce a 16-bit analogue-to-digital converter.

Referring to FIG. 8 an analogue input voltage Vin on line 802 is provided to a flash ADC 804 and to one input of each of a plurality of transconductance difference amplifiers 816a–d, four in the illustrated example. Flash ADC 804 has eight coarse (MSB) comparators with thresholds at −7/8, −5/8, −3/8, −1/8, +1/8, +3/8, +5/8 and +7/8 of the reference range. These thresholds determine the input voltage to be in one of nine regions, centred on −8/8, −6/8, −4/8, −2/8, 0, +2/8, +4/8, +6/8, +8/8. The flash ADC 804 provides a digital output on line 806 which is provided to a combiner 808 and to a digital-to-analogue converter 812. This digital output comprises a sign bit plus three additional bits to define a 2's complement number in the range [−4, +4] (not all of the 16 codes defined by the 4 bits are used). Combiner 808 adds the MSB information from the flash ADC to LSB information on bus 836 with appropriate delays to provide a 6-bit output on bus 810.

The most significant bits received by DAC 812 are converted back to an analogue voltage VrefM on line 814, which is provided to a second input of each of transconductance difference amplifiers 816a–d. The DAC 812 may comprise, for example, a multiplexer constructed from a plurality of transmission gates configured to select taps on a resistor string.

The possible VretM voltages on line 814 are −8/8, −6/8, −4/8, −2/8, 0, +2/8, +4/8, +6/8 and +8/8 or, equivalently, −4/4, −3/4, −2/4, −1/4, 0, +1/4, +2/4, +3/4 and +4/4 of the reference range. It will be appreciated that the value of VrefM output by DAC 812 will lie in the middle of the region of the reference range in which flash ADC 804 determines the input voltage on line 802 to lie. The voltage VrefM is fed to the reference inputs of the four difference amplifiers 816a–d, that is the input corresponding to input 304 of FIG. 4, and the input voltage Vin is fed to the associated input of difference amplifiers 816a–d, that is to the input corresponding to input 302 of the difference amplifier illustrated in FIG. 4.

Figure 1A:
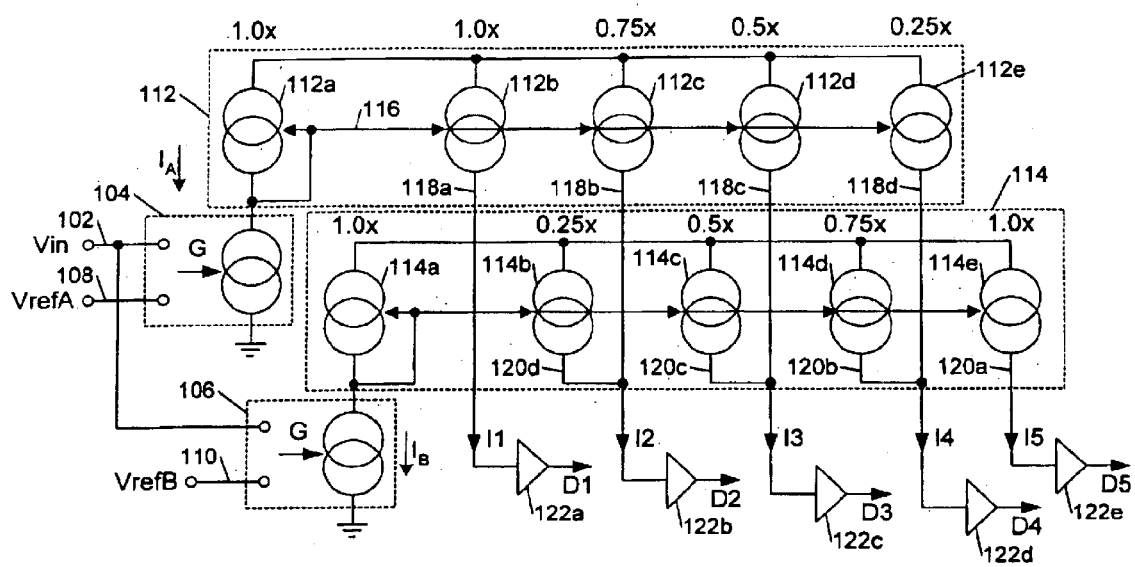
FIGS. 1a to 1c, show respectively, a generalised circuit diagram of an exemplary stage of a current-mode interpolating analogue-to-digital converter, an example of a differential transconductance amplifier, and an example of a controllable current generator.
Figure 2:
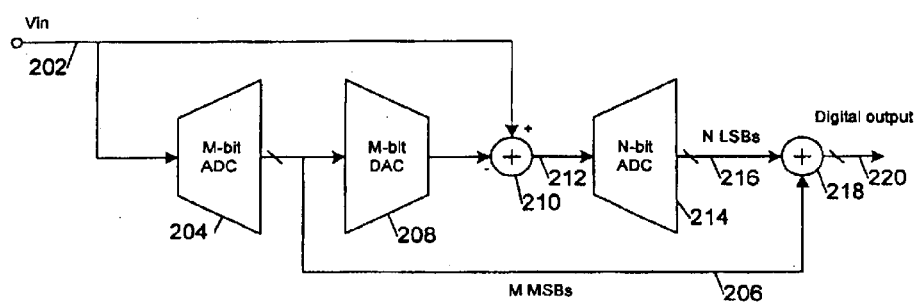
FIG. 2 shows a typical two-stage analogue-to-digital converter.

The pair of inputs 818a–d of each of the four difference amplifiers 816a–d thus corresponds to inputs 302 and 304 of the difference amplifier of FIG. 4. Each of difference amplifiers 816a–d also has a second pair of inputs 820a–d corresponding to inputs 402 and 404 of the difference amplifier of FIG. 4. Input pair 818 is connected to an input sampling capacitor 826 (C1 in FIG. 4) and input pair 820 is connected to a second input sampling capacitor 828 (C2 in FIG. 4). The transconductance amplifier sides of both these capacitors are connected together and to the inverting input of transconductance amplifier 830 (as shown in FIG. 4). The output of transconductance amplifier 830 is mirrored or split as illustrated in FIG. 6 or 7, or a plurality of transconductance amplifiers may be employed as illustrated in FIG. 5, to provide a plurality of current outputs 832 for each of difference amplifiers 816a–d. For example difference amplifier 816a provides current outputs in the ratio 1.0:0.8:0.6:0.4:0.2. Current outputs from difference amplifiers 816a–d are summed as illustrated in FIG. 8 in a conventional manner for an interpolating ADC, for example as described with reference to FIG. 1. Multiple current outputs at a given scaling factor, for example 0.2, may be provided where the current output at that scaling factor is used more than once. This may be implemented by a conventional current mirror with one output transistor for each of outputs 832 along the lines illustrated in FIG. 6. Alternatively arrangements such as those shown in FIG. 5 and/or 7 may be employed. For simplicity the clock generator controlling difference amplifiers 816a–d is not shown in FIG. 8.

Each pair of inputs 820a–d has a first input connected to a common reference voltage line 822, as illustrated at the 0 volts, and a second input connected to a respective second reference voltage line 824a–d. The second reference voltages on lines 824a–d form a ladder of reference voltages, in the illustrated example spaced apart by 5/16 of the reference range. Accordingly the reference voltage applied to each of difference amplifiers 816d–a is −8/16, −3/16, +2/16 and +7/16 of the reference range and varies linearly. Capacitor 826 of each difference amplifier (C1 in FIG. 4) has a value twice that of capacitor 828 (C2 in FIG. 4). Choosing C1 larger than C2 reduces the attenuation in the signal path from Vin to the transconductance amplifier input. This capacitor ratio of 1/2 sets the LSB conversion range to be from −8/32 to +7/32 of the reference range and, due to the double subtraction (i.e. because the difference amplifier output is also dependent upon Vin−VrefM), this LSB conversion range is centred around the approximation to the input voltage VrefM. The input range extrema are +31/32 and −32/32 to give 64 codes, so that the LSB step size is $1/32=1/2^5$ even though the illustrated converter is a 6-bit converter.

Current interpolation between the outputs 832 of difference amplifiers 816a–d generates a range of currents with zero crossing thresholds equivalent to one LSB apart. To achieve this there are five weighted current mirrors between adjacent difference amplifiers, giving 16 output taps including endpoints. The threshold determined by the current output of difference amplifier 816a alone is +7/32 of the reference range; the threshold determined by difference amplifier 816b alone is +2/32 of the reference range; the threshold determined by difference amplifier 816c is −3/32; and the threshold determined by difference amplifier 816d is −8/32 of the reference range. There are four intermediate thresholds between each of these formed by summing fifths of the output currents, in a similar manner to the way in which, in the arrangement of FIG. 1, three intermediate thresholds are defined by summing quarters of the output currents. Zero-crossing comparators 834 on these 16 taps determine the difference (VrefM−Vin) to lie within one of 17 regions, and provide a thermometer code output on bus 836. This thermometer code is converted to a conventional binary code for combining with the MSBs on bus 806 by combiner 808. The use of current interpolation rather than resistive interpolation improves the linearity of the ADC by removing end effects due to mismatched impedances at the top and bottom of a resistive interpolation string.

The foregoing discussion may be clarified by an example. Difference amplifier 816a has capacitor C2 828 switched between +7/16 and 0 volts. Inspection of equation 1 shows that when capacitor C2 is half the value of C1 (capacitor 826) the voltage difference on inputs 820a is effectively given half the weight of the voltage difference on inputs 818a of difference amplifier 816a. Thus the zero crossing threshold for difference amplifier 816a is shifted by +7/32. Since the voltage difference on input pair 820a is, in effect, of opposite sign to the voltage difference on input pair 818a the voltage Vin on line 802 must be+7/32 of the reference range higher than VrefM on line 814 for zero output current. Thus it can be seen that the "1.0 times" output of difference amplifier 816a defines a threshold at +7/32 of the reference range. The "1.0 times" output of difference amplifier 816b defines a threshold at +2/32 of the reference range in a similar way. The +6/32 threshold is defined by summing 0.8 of the current output of difference amplifier 816a and 0.2 of the current output of difference amplifier 816b, according to the equation 0.8×(7/32)+0.2×(2/32)=6/32. The other thresholds are defined similarly at 2/5, 3/5 and 4/5 of the difference between +7/32 and +2/32. The thresholds from +1/32 to −8/32 are defined in a corresponding manner.

Strictly speaking only 8 comparators are need to cover the full range between each VrefM, the additional comparators in effect providing an extra MSB. However it is preferable to provide additional comparators since these provide a margin for error in the comparator thresholds of flash ADC 804. The 16 thresholds define 17 regions (compare the description of Flash ADC 804 above) and the 16 outputs from comparators 834 are preferably encoded as a twos complement LSB value in the range [−8, +8], although in other embodiments other schemes and ranges may be employed. The complete digital output value may then be calculated simply by adding the 2's Complement MSB's from flash ADC 804 to the 2's complement LSBs from the second, interpolating ADC stage, appropriately shifting the MSBs left, according to the equation:

$$\text{Output} = 8 \times MSB + LSB.$$

Adding the digital output signals from the two stages in this way automatically provides correction for conversion errors made by flash ADC 804 for example because of offset voltages in the flash ADC comparators. Even if the digital output from flash ADC 804 is "incorrect", the output from the DAC will still be consistent with this digital output, which will alter the reported second stage region by an amount which automatically corrects for the error in VrefM once the respective digital outputs are combined. This LSB over-range can accommodate an offset in the flash ADC comparators of approximately 1/16 of the (flash) reference range.

A further benefit of providing additional comparators in excess of the number required for the desired number of LSBs accuracy is to provide the two-stage ADC 800, considered as a whole, with an over-range capability. This is because the overall digital output extends over the range [−40, +40], a total of 81 codes, because in effect there are 8 additional codes provided by the second-stage, difference amplifier-based ADC at either end of the range. This is because the extreme codes from the flash correspond to regions centred on+/−8/8 Vref, giving nominally 0/64 at the LSB stage for nominal full-scale inputs, thus giving 8 extra codes at either end. Of these codes, 64 can be considered "in range", corresponding to inputs that lie within the reference range and the remainder can be considered "over-range" codes. Where, as mentioned above, the ADC is used to provide a backend to a pipeline or other converter, this over-range capability may be employed to correct comparator offset voltages or other errors in a preceding converter or converters.

Figure 9A:
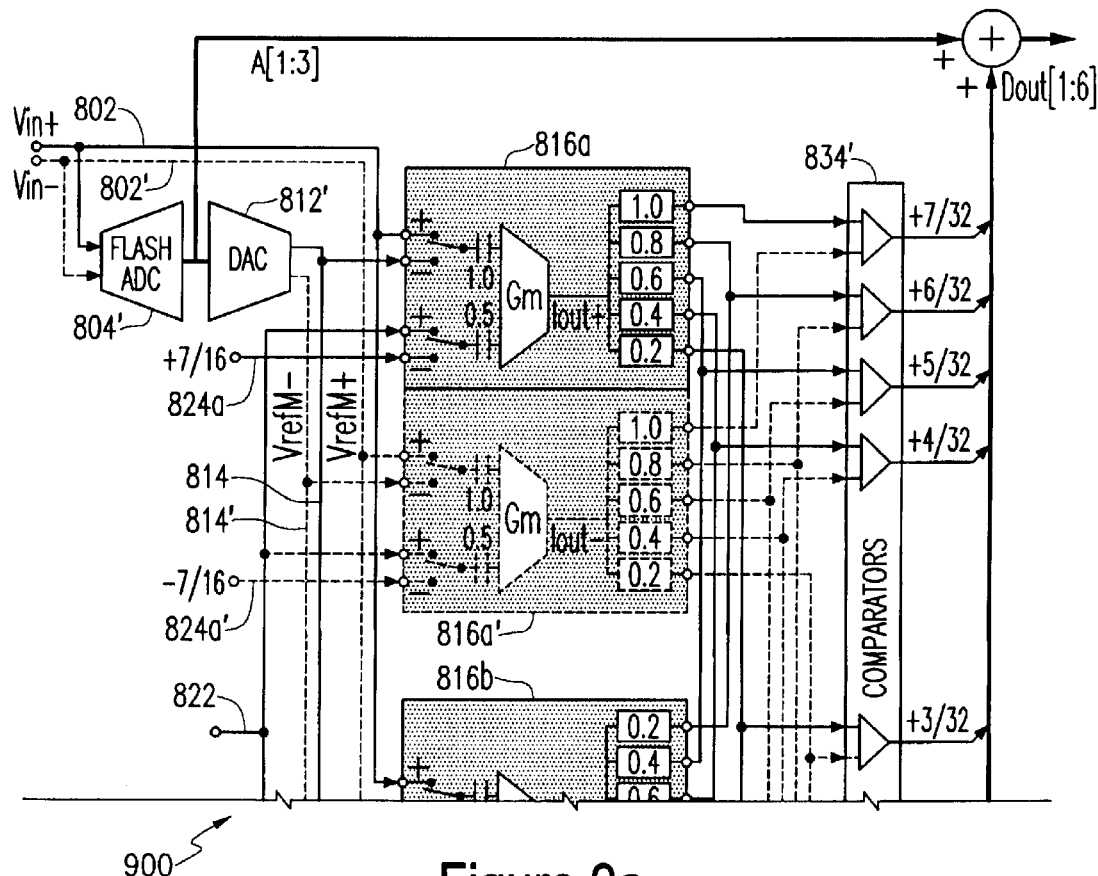
FIGS. 9a and 9b show, respectively, a portion of a differential version of the interpolating ADC of FIG. 8, and a differential input current comparator.

The arrangement of FIG. 8 shows a single-ended rather than a differential analogue-to-digital converter but the skilled person will readily recognise the architecture may be modified to provide a differential implementation in a routine manner as indicated in FIG. 9a, which shows a portion of a differential version 900 of the interpolating ADC of FIG. 8, in which like elements to those of FIG. 8 are indicated by like reference numerals. A single-ended implementation has been described to facilitate understanding of the invention but in many instances a differential implementation is preferred as it enables an improvement in signal-to-noise ratio, as internal signal swings may be doubled for a fixed supply headroom and extraneous interfering signals are rejected.

Referring to FIG. 9a, this illustrates a portion of one embodiment of a differential version 900 of the single-ended circuit of FIG. 8. The interpolating ADC 900 has a differential voltage input Vin+802, Vin−802' which is provided to both a differential input Flash ADC 804' and to a plurality of pairs of transconductance difference amplifiers of which one pair 816a, 816a' is shown. Flash ADC 804' drives a differential output DAC 812' which in turn drives the pairs of difference amplifiers.

The positive voltage input Vin+802 goes to a first 816a transconductance difference amplifier of the pair and the negative voltage input Vin−802' goes to the second 816a' transconductance difference amplifier of the pair. The transconductance difference amplifiers 816a, 816a' of the pair are substantially identical, one outputting a positive current Iout+, the other 816a' outputting a negative output current Iout−. This pair of output currents, and each other pair of output currents from the remaining pairs of transconductance difference amplifiers (not shown in FIG. 9a) are provided, scaled in a similar way to that described with respect to FIG. 8, to differential inputs of a set of differential input current comparators 834'.

Positive and negative versions of the difference amplifier reference voltages are provided, one to each of the difference amplifiers of each pair. Thus, for example, a reference 824a at +7/16 of the reference range is provided to difference amplifier 816a and a reference 824' at −7/16 of the reference range is provided to difference amplifier 816a'. Differential versions of each of the other reference voltages are provided to corresponding ones of the other pairs of difference amplifiers. The common reference voltage 822 is provided to both the positive 816a and negative 816a' voltage processing difference amplifiers and, in embodiments, may be left floating as its voltage is "common mode" to each of the pairs of difference amplifiers. With this arrangement the reference voltages of the single-ended version of the ADC of FIG. 8, Vref, are replaced by differential pairs of reference voltages Vref+, Vref− each of the same amplitude as the previous single-ended Vref. This has the effect of doubling the "full scale" input range (i.e. ignoring over-range capability) since full scale is reached at Vin+=+2.0 and Vin−=−2.0 rather than at Vin=1.0, −1.0. However the same full scale range may be obtained by halving the reference voltages.

Figure 9B:
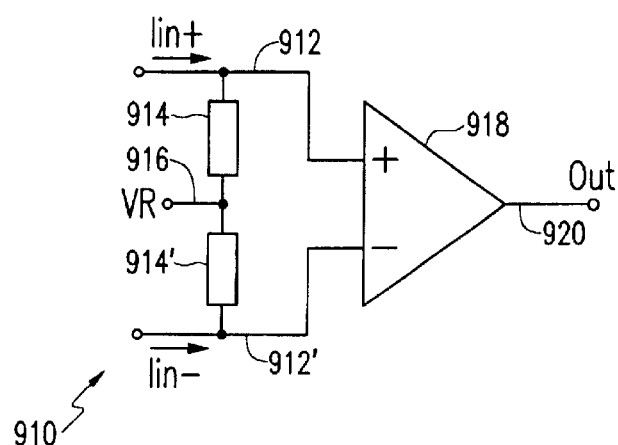

FIG. 9b shows one implementation of a differential input current comparator 910 suitable for use in comparator bank 834' of the differential interpolating ADC 900. Current comparator 910 has a pair of differential current inputs Iin+ 912, Iin−912', each connected to a respective resistor 914, 914', the other ends of these resistors being connected together to a common-mode voltage source VR 916. The inputs 912, 912' are also connected to respective non-inverting and inverting inputs of a conventional differential input voltage comparator 918 which in turn provides an output 920. The skilled person will recognise that the arrangement of FIG. 9b may be modified to suit a particular application and/or to meet bias constraints on the transconductance amplifier stages. For example one or more common gate stages may be added in series with each input, or MOS resistors may be employed for resistors 914, 914', or these resistors may be replaced by a cross-coupled MOS transistors to increase the voltage gain of the comparator.

Figure 10:
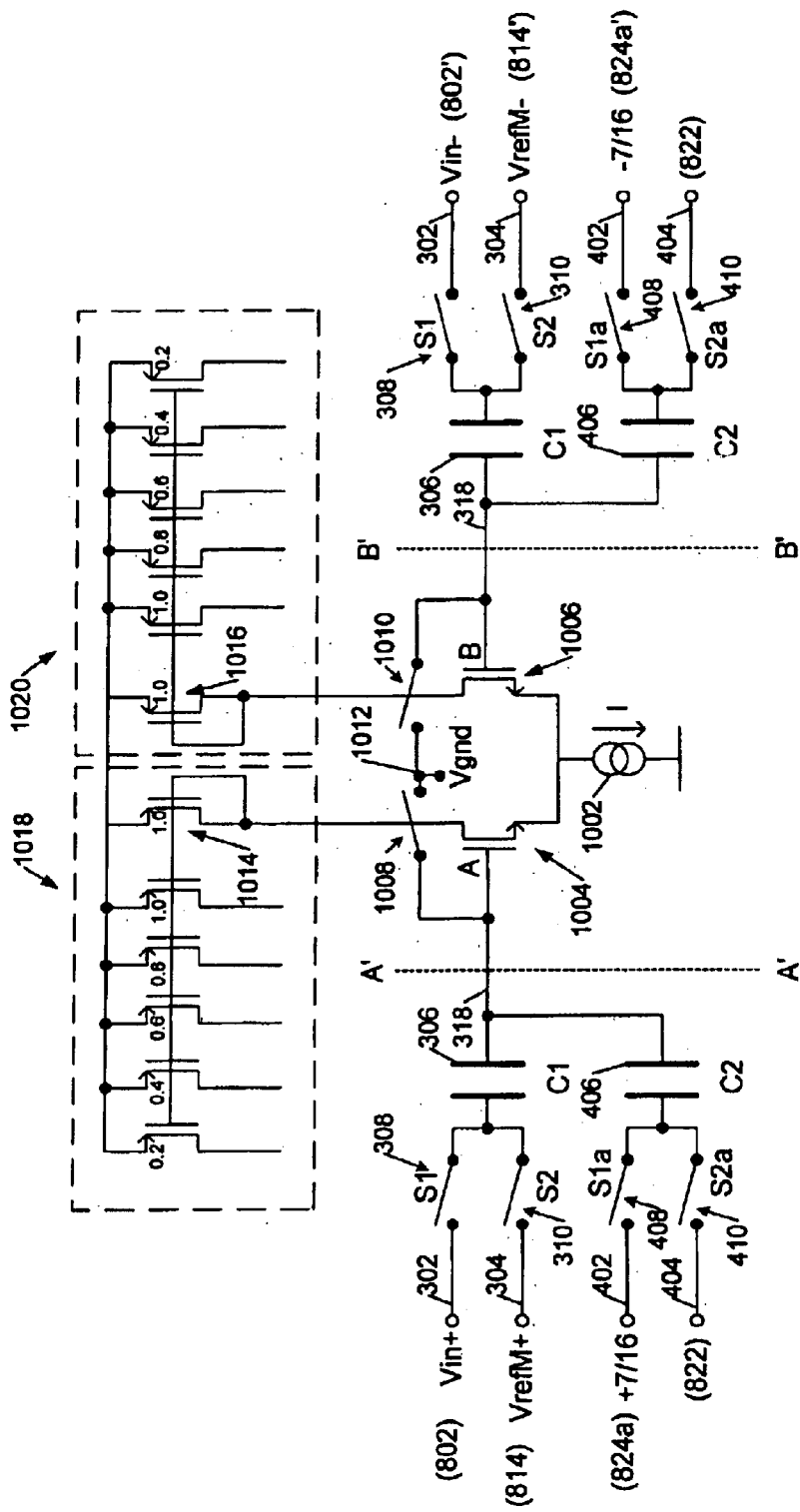
FIG. 10 shows an embodiment of a differential difference amplifier according to an aspect of the present invention.

FIG. 10 shows one example of a differential difference amplifier suitable for use for the pair of positive 816a, and negative 816a' difference amplifiers described above with reference to FIG. 9a. Although the differential difference amplifier of FIG. 10 may be considered as a pair of differential amplifiers it is perhaps better viewed as a combined differential difference amplifier 1000.

Figure 1B:
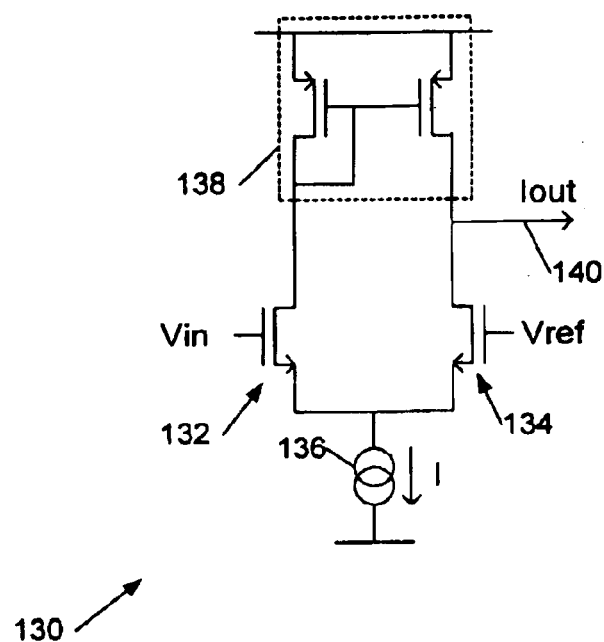
Figure 1C:
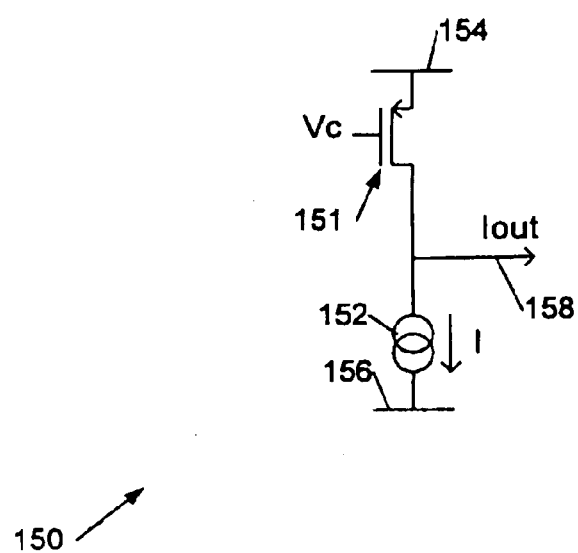

Broadly speaking the differential difference amplifier 1000 of FIG. 10 is a combination of two single-ended differential amplifiers of the type shown in FIG. 4 with a differential transconductance amplifier similar to that shown to that in FIG. 1b. Thus in FIG. 10 the circuitry to the left of line A'−A' corresponds to the input circuitry of the FIG. 4 difference amplifier embodiment, as does the circuitry to the right of line B'−B', these two sets of input circuitry providing differential inputs A and B to a differential transconductance amplifier. The reference numerals for the circuit portions correspond to those of FIG. 4 and, for convenience, reference numerals for the lines to which the differential difference amplifier is attached when used in the analogue-to-digital converter of FIG. 9a are indicated in brackets. Broadly speaking elements 1002, 1004, 1006, and the combination of 1014 and 1016 of FIG. 10 correspond to elements 136, 132, 134 and 138 of FIG. 1b respectively.

The differential transconductance amplifier comprises a current sink 1002 coupled to the source connections of a differential pair of input transistors 1004, 1006, each of which has a drain connected to a respective (active load FET) transistor 1014, 1016.

The current through FETs 1014 and 1016 is mirrored by respective sets of scaled PMOS transistors 1018, 1020 to provide scaled sets of differential (current) outputs, in a broadly similar manner to the NMOS devices 602 of FIG. 6. Respective switches 1008, 1010 are provided for transistors 1004, 1006, each corresponding to switch S3 316 of FIG. 4, and connected to a voltage preset line 1012 (to preset the voltages on the transconductance amplifier side plates of capacitors C1 and C2), in the illustrated embodiment connected to ground. In FIG. 10 switches S1, S2, S1a, S2a, 1008 and 1010 are controlled by a controller or clock generator (not shown in FIG. 10, for clarity) in a similar manner to that described above with reference to FIGS. 3b and 3d.

In a first state or clock phase switches S1 and S1a are closed to couple first voltage inputs on lines 302 and 402 to one side of the input sampling capacitors C1 and C2 and switches 1008 and 1010 are closed to allow the other sides of these capacitors to come to an initial voltage either by sharing charge or by having their plates connected to a bias or virtual earth voltage. Then in a subsequent state or clock phase these switches are all opened and switches S2 and S2a are closed to apply second input voltages to capacitors C1 and C2 to provide differential input voltage changes dependent upon the differences between the first and second input voltages of each set to the differential inputs of the transconductance amplifier.

In operation the input stages of differential difference amplifier 1000 operate similarly to the input stages of the difference amplifier of FIG. 54. Thus input A to the differential transconductance amplifier receives a change in voltage dependent upon the difference between Vin⁺ and VrefM⁺ plus an offset (scaled by capacitor C2) dependent upon the difference between the voltage on line 824a and that on line 822. Likewise input B receives a change in voltage dependent upon the difference between Vin⁻ and VrefM⁻ plus an offset (scaled by capacitor C2) dependent upon the voltage difference between lines 824a' and 822. The transconductance amplifier provides an output current dependent upon the difference between the voltages at differential input nodes A and B and provides a differential output (in other embodiments this could be a single-ended output) across load FETs 1014 and 1016, these output currents being mirrored by sets of FETs 1018 and 1020 respectively. In other words, one of nodes A and B may be considered as a positive differential input and the other considered as a negative differential input and the differential transconductance amplifier provides a differential output comprising output currents of substantially the same magnitude but of opposite sign.

The skilled person will recognise that a number of variations on the circuit of FIG. 10 are possible. For example the current mirrors made up of transistors 1014, 1018, 1016, 1020 could be replaced an output stage similar to that shown in FIG. 7 comprising FETs 702.

Additionally or alternatively elements 1002, 1004 and 1006 could be replicated along the lines indicated in FIG. 5 and the PMOS current mirrors could be reduced in number or removed. Switches 1008 and 1010, which are shown connected to a bias voltage such as a ground voltage, could be connected instead to a virtual earth, for example to the respective gates of transistors 1014 and 1016 (switches 1008 and 1010 then being separate rather than connected together). The skilled person will further recognise that the common reference voltage line 822 may be any convenient bias voltage, and that in embodiments this line may be allowed to float (that is not connected to any specific bias voltage) in which case capacitors C2 406 would share charge when switches S2a 410 were closed (i.e. on).

The requirements on a transconductance amplifier used in an interpolating ADC, such as ADC 800 of FIG. 8, are relatively modest. The accuracy of the converter depends upon the accuracy of the two difference amplifiers that have the smallest input signals. For the example of FIG. 8 the only amplifiers participating in any decision will at most have about +/−4/64 input voltage, and the resulting output need only be correct to say 0.5LSB=1/64. For this reason in many such applications the difference amplifiers do not require any feedback, nor must they be particularly high gain, or low offset, or accurate settling difference amplifiers. Settling time problems are unlikely to arise with the output of the most critical difference amplifier as the output of this amplifier only has to settle to a small voltage, since the accuracy is only critical near the threshold points, where the amplifier sees only small differential voltages. The difference amplifiers can therefore be very small and simple and the transconductance amplifier need only comprise a simple long-tailed bipolar or MOS pair, as shown for example in FIG. 1b. Nonetheless the difference amplifiers are still the most sensitive part of the design.

The gain from the ADC signal input line 802 to the inputs to comparators 834 is typically of the order of Gm/Gout, where Gout is the output impedance at the scaled current outputs (reduced by the capacitive attenuation at the differential amplifier input capacitive network). This is equivalent to the preamplifier often included before a comparator in a conventional ADC, so provides a sufficiently large comparator overdrive to allow the use of a simple comparator architecture, such as a simple differential latch, without a separate preamplification stage.

The reference voltages for lines 824a–d may be generated by a resistor string and preferably this is arranged to have sufficiently low impedance to be able to provide the current required by the switched input sampling capacitors (such as capacitor 828 in FIG. 8) without suffering significant loading effects. It is further preferable that the second stage LSB over-range provision is sufficient to overcome offset errors in the MSB (flash ADC) comparators.

No doubt many effective variants of the above-described circuits will occur to the skilled person. For example switch S3 316 in the circuit of FIG. 3a may be connected to a reference voltage to set a charge on capacitor C1 306 rather than to the output 314 of transconductance amplifier 312 and, optionally, an additional switch may be interposed between node X 318 and the inverting input of transconductance amplifier 312 (although this would effectively remove the auto-zero function of the circuit). Likewise it is generally possible to exchange current sources for sinks and vice versa. It will be understood that the invention is not limited to the described embodiments and encompasses modifications apparent to those skilled in the art lying within the spirit and scope of the claims appended hereto.

I claim:

1. A difference amplifier configured for providing an output current dependent upon a difference between a first input voltage and a second input voltage, the difference amplifier comprising:

an input sampling capacitor having two conductors;

a transconductance amplifier having an input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

the difference amplifier being configured to, in a first state, couple said second conductor to one of said first and second inputs and apply a voltage to said first conductor and to, in a second open loop state, couple said second conductor to the other of said first and second inputs to provide a voltage change to said transconductance amplifier input dependent upon said difference between said first and second input voltages.

2. A difference amplifier as claimed in claim 1 wherein said transconductance amplifier comprises a substantially linear transconductance amplifier whereby said difference amplifier output current is substantially linearly dependent upon said difference between said first and second input voltages.

3. A difference amplifier as claimed in claim 1 wherein said transconductance amplifier comprises a differential transconductance amplifier and said voltage applied to said first conductor in said first state is a virtual earth voltage.

4. A difference amplifier as claimed in claim 1 wherein said transconductance amplifier comprises a differential transconductive amplifier with two differential inputs, and wherein a first of said differential inputs is coupled to said first conductor and a second of said differential inputs is coupled to a sampling capacitor reference voltage, said differential transconductive amplifier being configured, in said first state of said difference amplifier, such that said first differential input has substantially the same voltage as said second differential input.

5. A difference amplifier as claimed in claim 4 further comprising a second switch to, in said first state, provide a closed loop resistive feedback path for said differential transconductance amplifier.

6. A difference amplifier as claimed in claim 4 further comprising a second switch configured to switchably couple said first conductor to a point driven by said transconductance amplifier output.

7. A difference amplifier configured for providing an output current dependent upon a difference between a first input voltage and a second input voltage, the difference amplifier comprising:

an input sampling capacitor having two conductors;

a plurality of transconductance amplifiers for providing a plurality of output currents, each of said differential transconductance amplifiers having one differential input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

wherein the difference amplifier is configured to, in a first state couple said second conductor to one of said first and second inputs and apply a virtual earth voltage to said first conductor and to, in a second state, couple said second conductor to the other of said first and second inputs to provide a voltage change to said transconductance amplifier input dependent upon said difference between said first and second input voltages.

8. A difference amplifier configured for providing an output current dependent upon a difference between a first input voltage and a second input voltage, the difference amplifier comprising:

an input sampling capacitor having two conductors;

a transconductance amplifier having an input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

the difference amplifier being configured to, in a first state, couple said second conductor to one of said first and second inputs and apply a voltage to said first conductor and to, in a second state, couple said second conductor to the other of said first and second inputs to provide a voltage change to said transconductance amplifier input dependent upon said difference between said first and second input voltages;

said difference amplifier further comprising:
third and fourth inputs for receiving third and fourth input voltages;
a second input sampling capacitor having two second capacitor conductors; and
a second input switch;
a first of said second capacitor conductors being coupled to said first conductor and a second of said second capacitor conductors being coupled to said second input switch, said second input switch being configured to selectively couple said second conductor of said second capacitor to said third input and to said fourth input, whereby said output current is further dependent upon a difference between said third and fourth input voltages.

9. A difference amplifier as claimed in claim 8 wherein one of said first and second voltage inputs comprises a first reference voltage input and one of said third and fourth voltage inputs comprises a second reference voltage input.

10. A difference amplifier configured for providing an output current dependent upon a difference between a first input voltage and a second input voltage, the difference amplifier comprising:

an input sampling capacitor having two conductors;

a transconductance amplifier having an input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

the difference amplifier being configured to, in a first state, couple said second conductor to one of said first and second inputs and apply a voltage to said first conductor and to, in a second state, couple said second conductor to the other of said first and second inputs to provide a voltage change to said transconductance amplifier input dependent upon said difference between said first and second input voltages;

said difference amplifier further comprising a current mirror coupled to the output of said transconductance amplifier to mirror an output current from a said transconductance amplifier.

11. A difference amplifier as claimed in claim 10 wherein said current mirror is configured to provide a plurality of mirrored versions of said difference amplifier output current in substantially fixed mutual ratios.

12. A difference amplifier configured for providing an output current dependent upon a difference between a first input voltage and a second input voltage, the difference amplifier comprising:

an input sampling capacitor having two conductors;

a transconductance amplifier having an input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

the difference amplifier being configured to, in a first state, couple said second conductor to one of said first and second inputs and apply a voltage to said first conductor and to, in a second state, couple said second conductor to the other of said first and second inputs to provide a voltage change to said transconductance amplifier input dependent upon said difference between said first and second input voltages;

said difference amplifier further comprising a plurality of output transistors for splitting an output current from said transconductance amplifier to provide a plurality of versions of said different amplifier output current.

13. A difference amplifier as claimed in claim 12 wherein said output transistors have a common bias voltage.

14. A difference amplifier as claimed in claim 12 wherein said output transistors are configured such that said versions of said output current have substantially fixed mutual ratios.

15. A differential difference amplifier comprising a pair of difference amplifiers for processing differential pairs of said first and second input voltages and for providing a differential output, each of said difference amplifiers comprising:

an input sampling capacitor having two conductors;

a transconductance amplifier having an input coupled to a first conductor of said input sampling capacitor and a current output for generating said output current; and an input switch for selectively coupling a second conductor of said input sampling capacitor to a first input of said difference amplifier for receiving said first input voltage and to a second input of said difference amplifier for receiving said second input voltage;

the difference amplifier being configured to, in a first state, couple said second conductor to one of said first and second inputs and apply a voltage to said first conductor and to, in a second state, couple said second conductor to the other of said first and second inputs to provide a voltage change to said transconductance amplifier input dependent upon said difference between said first and second input voltages.

16. A differential difference amplifier as claimed in claim 15 wherein the transconductance amplifier of each difference amplifier of said pair of difference amplifiers is a shared differential transconductance amplifier, whereby the difference amplifiers of said differential difference amplifier have a single, common differential transconductance amplifier.

17. An interpolating analogue to digital converter incorporating a difference amplifier according to claim 1.

18. A differential difference amplifier for providing an output current dependent upon a differential signal at a differential input comprising two pairs of signal inputs, said differential signal comprising two voltage differences, a first being dependent upon a difference between first and second input voltages on a first pair of said pairs of signal inputs, a second being dependent upon a difference between third and fourth input voltages on a second pair of said pairs of signal inputs, said differential difference amplifier comprising:

first and second input sampling capacitors, each having two conductors, for said first and second pair of signal inputs respectively;

a differential transconductance amplifier having a differential input coupled to said first and second input sampling capacitors and an output for generating said output current;

a pair of input switches, one for each of said input pairs, for selectively coupling said first and second input sampling capacitors respectively to one of said first and second input voltages and to one of said third and fourth input voltages;

a pair of initialisation switches to bring plates of said first and second input sampling capacitors coupled to said differential transconductance amplifier to initial voltages; and a controller to control said input switches and said initialisation switches to apply said differential signal to said differential transconductance amplifier.

19. A differential difference amplifier as claimed in claim 18 further comprising third and fourth input sampling capacitors, and a second pair of input switches for selectively coupling said third and fourth input sampling capacitors to a second differential input comprising third and fourth voltage difference inputs.

20. An interpolating analogue to digital converter incorporating a difference amplifier according to claim 18.

21. An analogue-to-digital converter comprising:

at least one transconductance amplifier configured to provide a plurality of output currents at a plurality of outputs; and a plurality of comparators coupled to said plurality of transconductance amplifier outputs for providing a digital output;

at least one switched input sampling capacitor coupled to an input of said transconductance amplifier; and at least one switch configured to couple said input sampling capacitor alternately to a first reference voltage and to an analogue voltage for conversion.

22. An analogue to digital converter as claimed in claim 21 comprising:

first and second input sampling capacitors each coupled to the input of said transconductance amplifier; and first and second switches, said first switch being configured to connect said first input sampling capacitor alternately to said first reference voltage and to said analogue voltage for conversion, said second switch being configured to connect said second input sampling capacitor alternately to second and third reference voltages.

23. An analogue-to-digital converter as claimed in claim 22 comprising a plurality of said transconductance amplifiers each having respective first and second input sampling capacitors and first and second switches.

24. An analogue-to-digital converter as claimed in claim 23 wherein one of said second and third reference voltages is common to said plurality of transconductance amplifiers and wherein the others of said second and third reference voltages of each of said transconductance amplifiers are arranged as a ladder.

25. An analogue-to-digital converter as claimed in claim 24 wherein current outputs of said transconductance amplifiers are combined to provide a plurality of current signals for said plurality of comparators, said current signals having zero crossings at substantially equal increments of said analogue voltage.

26. An analogue-to-digital converter as claimed in claim 21 wherein said analogue voltage for conversion is a differential voltage, and wherein the analogue-to-digital converter comprises a differential version of said transconductance amplifier having a differential pair of inputs each with a said input sampling capacitor and a said switch, for converting said differential analogue voltage to a digital format.

27. A two-stage analogue-to-digital converter comprising a first analogue to digital converter to provide a coarse approximation to an analogue input signal and a second analogue-to-digital converter as claimed in claim 21 for providing one for more least significant digital output bits for said two-stage analogue-to-digital converter, wherein said first reference voltage comprises said coarse input signal approximation.

28. A method for generating a current in substantially linear dependence upon a voltage difference between first and second voltages using a circuit comprising a switch, a switched input capacitor, and a substantially linear transconductance amplifier, a first plate of the input capacitor being coupled to an input of the transconductance amplifier, a second plate of the input capacitor being switchably coupleable to the first and second voltages, the method comprising:

coupling the second plate of the input capacitor to the first voltage whilst maintaining the first plate at a reference voltage to charge the input capacitor; and then coupling the second plate of the input capacitor to the second voltage and allowing the potential of the first plate to change by an amount dependent upon said voltage difference to cause said transconductance amplifier to generate. in an open loop state, an output current substantially linearly dependent upon said voltage difference.

29. A difference amplifier configured to operate in accordance with claim 28.

30. A method of generating a current substantially linearly dependent upon two voltage differences, a first voltage difference between first and second voltages and a second voltage difference between third and fourth voltages, the method employing a circuit comprising first and second switches, first and second switched input capacitors, and a substantially linear transconductance amplifier, a first plate of the first input capacitor and a first plate of the second input capacitor being coupled together and coupled to an input of the transconductance amplifier, a second plate of the first input capacitor being coupled to the first switch for switchable coupling to the first and second voltages and a second plate of the second input capacitor being coupled to the second switch for switchable coupling to the third and fourth voltages, the method comprising:

coupling the second plates of the first and second input capacitors to the first and third voltages respectively whilst maintaining the first plates of the capacitors at a reference voltage, to charge the input capacitors; and then coupling the second plates of the first and second input capacitors to the second and fourth voltages respectively and allowing the charge on the first plates of the capacitors to be shared such that the potential of the first plates changes by an amount dependent upon both said first and second voltage differences to cause said transconductance amplifier to generate output current substantially linearly dependent upon both said voltage differences.

31. A method as claimed in claim 30 further comprising scaling the first and second input voltage differences by correspondingly scaling capacitances of said first and second input capacitors.

32. A difference amplifier configured to operate in accordance with claim 30.

33. A method of operating a two-stage analogue-to-digital converter, the two-stage analogue-to-digital converter comprising a first analogue to digital converter to provide a coarse approximation to an analogue input signal and a second analogue-to-digital converter comprising at least one difference amplifier configured for providing an output current dependent upon a difference between a first input voltage and a second input voltage, the difference amplifier comprising a transconductance amplifier for providing said output current for a comparator for providing a digital output, at least one switched input sampling capacitor coupled to an input of said transconductance amplifier, and at least one switch configured to couple said input sampling capacitor alternately to said first and second input voltages, the method comprising:

controlling said switch to couple said input sampling capacitor first an analogue voltage for conversion and then to said course input signal approximation to provide a reference voltage.

34. A method as claimed in claim 33 wherein difference amplifier output current is substantially linearly dependent upon said difference between said first and second input voltages.

35. A method as claimed in claim 33 wherein said second analogue-to-digital converter comprises a plurality of said difference amplifiers, the method further comprising determining a plurality of reference levels for comparison with said coarse input signal approximation for use by said second analogue-to-digital converter.

36. An analogue-to-digital converter configured to operate in accordance with claim 33.

* * * * *